US006235554B1

(12) United States Patent
Akram et al.

(10) Patent No.: US 6,235,554 B1
(45) Date of Patent: *May 22, 2001

(54) METHOD FOR FABRICATING STACKABLE CHIP SCALE SEMICONDUCTOR PACKAGE

(75) Inventors: Salman Akram; Alan G. Wood, both of Boise; Warren M. Farnworth, Nampa, all of ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 77 days.

(21) Appl. No.: 09/316,997

(22) Filed: May 24, 1999

Related U.S. Application Data

(60) Division of application No. 09/053,274, filed on Apr. 1, 1998, now Pat. No. 6,013,498, which is a continuation-in-part of application No. 08/688,060, filed on Jul. 29, 1996, now Pat. No. 5,739,585, which is a division of application No. 08/563,191, filed on Nov. 27, 1995, now Pat. No. 5,674,785.

(51) Int. Cl.[7] ................................................ H01L 21/44
(52) U.S. Cl. ..................... 438/109; 438/113; 438/125
(58) Field of Search ................................ 438/109, 113, 438/121, 125, 618, 637, 672, 675; 257/685, 686, 698

(56) References Cited

U.S. PATENT DOCUMENTS

| 3,648,131 | 3/1972 | Stuby . |
| 4,505,799 | 3/1985 | Baxter . |
| 4,649,418 | 3/1987 | Uden . |
| 4,725,924 | 2/1988 | Juan . |
| 4,731,645 | 3/1988 | Parmentier et al. . |
| 4,829,666 | 5/1989 | Haghiri-Tehrani . |
| 4,931,853 | 6/1990 | Ohuchi et al. . |
| 4,996,587 | 2/1991 | Hinrichsmeyer et al. . |
| 5,022,580 | 6/1991 | Pedder . |
| 5,043,794 | * 8/1991 | Tai et al. .............................. 257/686 |
| 5,048,179 | 9/1991 | Shindo et al. . |
| 5,063,177 | 11/1991 | Geller et al. . |
| 5,107,328 | 4/1992 | Kinsman et al. . |
| 5,138,434 | 8/1992 | Wood et al. . |
| 5,155,067 | 10/1992 | Wood et al. . |
| 5,191,511 | 3/1993 | Sawaya . |
| 5,239,198 | 8/1993 | Lin et al. . |
| 5,384,689 | 1/1995 | Shen . |
| 5,397,917 | * 3/1995 | Ommen et al. ....................... 257/698 |

(List continued on next page.)

OTHER PUBLICATIONS

T. R. Anthony, "Forming electrical interconnections through semiconductor wafers", J. Appl. Phys., vol. 52, No. 8, Aug. 1981, pp. 5340–5349.

"Chip Scale Review", Vol. 1, No. 1, May 1997.

*Primary Examiner*—Kevin M. Picardat
(74) *Attorney, Agent, or Firm*—Stephen A. Gratton

(57) ABSTRACT

A stackable chip scale semiconductor package and a method for fabricating the package are provided. The package includes a substrate having a die mounting site wherein a semiconductor die is mounted. The package also includes first contacts formed on a first surface of the substrate, and second contacts formed on an opposing second surface of the substrate. Conductive vias in the substrate electrically connect the first contacts to the second contacts. In addition, the first contacts and the second contacts have a mating configuration, such that a second package can be stacked on and electrically connected to the package. The method for fabricating the package includes the steps of: laser machining and etching the vias, forming an insulating layer in the vias, and then depositing a conductive material within the vias.

25 Claims, 4 Drawing Sheets

U.S. PATENT DOCUMENTS

| | | |
|---|---|---|
| 5,422,514 | 6/1995 | Griswold et al. . |
| 5,426,072 | 6/1995 | Finnila . |
| 5,474,957 | 12/1995 | Urushima . |
| 5,528,080 | 6/1996 | Goldstein . |
| 5,578,869 | 11/1996 | Hoffman et al. . |
| 5,608,265 * | 3/1997 | Kitano et al. ............ 257/686 |
| 5,674,785 | 10/1997 | Akram et al. . |
| 5,689,091 * | 11/1997 | Hamzehdoost et al. ........ 257/698 |
| 5,696,033 | 12/1997 | Kinsman . |
| 5,723,907 | 3/1998 | Akram . |
| 5,739,585 | 4/1998 | Akram et al. . |
| 5,744,862 | 4/1998 | Ishii . |
| 5,783,866 * | 7/1998 | Lee et al. ............ 257/698 |
| 5,783,870 * | 7/1998 | Mostafazadeh et al. ........ 257/686 |
| 5,811,879 | 9/1998 | Akram . |
| 5,814,883 | 9/1998 | Sawai et al. . |
| 5,818,698 | 10/1998 | Corisis . |
| 5,834,945 | 11/1998 | Akram et al. . |
| 5,844,315 * | 12/1998 | Melton et al. ............ 257/686 |
| 5,915,977 | 6/1999 | Hembree et al. . |
| 5,931,685 | 8/1999 | Hembree et al. . |
| 5,962,921 | 10/1999 | Farnworth et al. . |
| 6,013,948 | 1/2000 | Akram et al. . |
| 6,020,629 | 2/2000 | Farnworth et al. . |
| 6,097,087 | 8/2000 | Farnworth et al. . |
| 6,107,109 | 8/2000 | Akram et al. . |

* cited by examiner

METHOD FOR FABRICATING STACKABLE CHIP SCALE SEMICONDUCTOR PACKAGE

CROSS REFERENCE TO RELATED APPLICATIONS

This application is a division of application Ser. No. 09/053,274, filed on Apr. 1, 1998, now U.S. Pat. No. 6,013,498 which is a continuation-in-part of application Ser. No. 08/688,060, filed Jul. 29, 1996, U.S. Pat. No. 5,739,585 which is a division of application Ser. No. 08/563,191, filed Nov. 27, 1995, U.S. Pat. No. 5,674,785.

FIELD OF THE INVENTION

This invention relates generally to semiconductor manufacture and specifically to the packaging of semiconductor dice.

BACKGROUND OF THE INVENTION

Semiconductor dice or chips are typically individually packaged for use in plastic or ceramic packages. This is sometimes referred to as the first level of packaging. The package is required to support, protect, and dissipate heat from the die and to provide a lead system for power and signal distribution to the die. The package is also useful for performing burn-in and functionality testing of the die.

One type of semiconductor package is referred to as a "chip scale package". Chip scale packages are also referred to as "chip size packages", and the dice are referred to as being "minimally packaged". Chip scale packages can be fabricated in "uncased" or "cased" configurations. Uncased chip scale packages have a "footprint" (peripheral outline) that is about the same as an unpackaged die. Cased chip scale packages have a peripheral outline that is slightly larger that an unpackaged die. For example, a footprint for a typical cased chip scale package can be about 1.2 times the size of the die contained within the package.

Typically, a chip scale package includes a substrate bonded to the face of the die. The substrate includes the external contacts for making outside electrical connections to the chip scale package. The substrate for a chip scale package can comprise a flexible material, such as a polymer tape, or a rigid material, such as silicon, ceramic, glass or FR-4. The external contacts for one type of chip scale package include solder balls arranged in a dense array, such as a ball grid array (BGA), or a fine ball grid array (FBGA). These dense arrays permit a high input/output capability for the chip scale package. For example, a FBGA on a chip scale package can include several hundred solder balls.

One aspect of chip scale packages is that the substrates and external contacts are difficult to fabricate. In addition, reliable electrical connections must be made to die contacts (e.g., bond pads) on the die contained within the package. Further, electrical paths must be formed on the substrate between the die contacts and the external contacts. With increasing contact densities, forming these electrical paths becomes increasingly expensive, and requires more complex fabrication processes. Accordingly, improved fabrication processes for chip scale packages are needed.

Another aspect of chip scale packages is the mounting of the packages to supporting substrates, such as printed circuit boards, and ceramic modules. This is sometimes referred to as the second level of packaging. Typically, the packages are surface mounted by reflowing the external contacts on the package to corresponding contacts on the supporting substrate. It would be advantageous for chip scale packages to be capable of denser second level packaging arrangements than conventional surface mount arrangements.

In view of the foregoing, the present invention is directed to an improved chip scale package and method of fabrication.

SUMMARY OF THE INVENTION

In accordance with the present invention an improved stackable chip scale package, and a method for fabricating the package, are provided. Also provided are improved electronic assemblies constructed using multiple packages in a stacked configuration.

The package, simply stated, comprises: a substrate, a die mounted to the substrate, a first set of external contacts on a first surface of the substrate, and a second set of external contacts on a second opposing surface of the substrate. The substrate includes a die mounting site, such as a cavity sized and shaped to retain the die. In addition, an interconnect opening and a wire bonding cavity in the substrate permit electrical connections (e.g., wire bonds, TAB bonds) to be made between the die, and conductors on the substrate.

The package also includes conductive vias formed in the substrate using a laser machining and etching process. The conductive vias electrically connect the first set of external contacts to the second set of external contacts. In addition, the first and second sets of external contacts have a mating configuration that permits multiple packages to be stacked, and electrically interconnected to one another and to a supporting substrate (e.g., PCB, module substrate).

In an illustrative embodiment the package substrate comprises silicon, but alternately can be germanium, ceramic or other etchable material. Fabrication of the package can be performed at the wafer level, by providing a silicon wafer on which multiple packages are formed, and then singulated into individual packages. Stacking of the packages can also be performed at the wafer level, in which case singulation can be on stacked wafers containing multiple packages.

An exemplary fabrication sequence can include the initial step of laser machining vias through the substrate. The die mounting cavities and interconnect cavities can then be formed in the substrate using one or more etch masks, and a wet etchant, such as KOH or TMAH. During the etch step, or during a separate etch step, the laser machined vias can also be etched. Etching the laser machined vias cleans and enlarges the vias.

Following etching, sidewalls of the vias can be insulated, and the vias filled with a conductive material, such as a deposited metal, or a conductive polymer. The conductive material can completely fill the vias, or can comprise thin layers that cover only the sidewalls of the vias. Depending on the conductive material, exemplary deposition processes include sputtering, CVD, electroless deposition, and filling the vias by capillary action. Subsequent to, or during, filling of the vias, patterns of conductors can be formed on the substrate, in electrical communication with the conductive material contained in the vias.

Following formation of the conductors, the external contacts can be formed on the substrate in electrical communication with the conductors. In the illustrative embodiment, the first set of external contacts comprise bumped members, such as solder balls, and the second set of external contacts comprise flat pads adapted for mating engagement with the bumped members. Alternately, other mating structures such as bumps and recesses, or pins and openings, can be employed to permit mating engagement of a first set of contacts on a package, to a second set of contacts on an adjacent stacked package.

Following formation of the external contacts, the dice can be mounted to the substrates, and electrically connected to the conductors and conductive vias. Exemplary processes for forming the electrical connections include wire bonding, TAB bonding and reflow solder bonding. The packages on the wafer can then be singulated into separate packages by cutting or shearing the wafer. Stacking and bonding of the contacts on adjacent stacked packages can be with a solder reflow process, or with a deposited and cured conductive polymer.

If the dice have been provided as known good die (KGD), the packages need not require further testing. Alternately, full functionality and burn-in tests can be performed on the packages, or on the stacked assemblies.

DETAILED DESCRIPTION OF THE PREFERRED EMBODIMENTS

Figure 1:
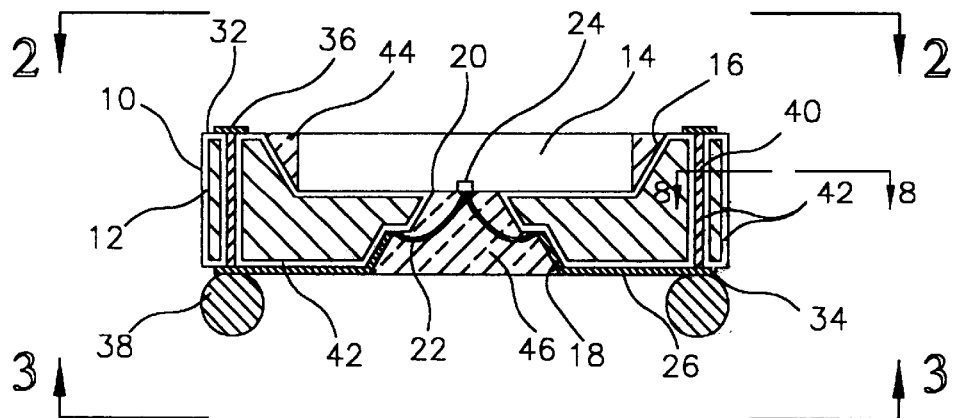
FIG. 1 is an enlarged schematic cross sectional view of a semiconductor package constructed in accordance with the invention.

Referring to FIG. 1, a stackable chip scale semiconductor package 10 constructed in accordance with the invention is illustrated. The package 10 includes a substrate 12 and a semiconductor die 14.

The substrate 12 is a generally rectangular shaped block of material, which in the illustrative embodiment comprises monocrystalline silicon. The substrate 12 includes a first surface 32 wherein a pattern of first contacts 36 are formed, and an opposing second surface 34 wherein a pattern of second contacts 38 are formed. The first surface 32 and the second surface 34 are major planar surfaces of the substrate 12, and are generally parallel to one another.

The first contacts 36 have a pattern P1 (FIG. 2) that exactly matches a pattern P2 (FIG. 3) of the second contacts 38. In the illustrative embodiment the first contacts 36 comprise planar metal pads, and the second contacts 38 comprise solder balls. However, as will be further explained, other configurations can be provided for the first contacts 36, and the second contacts 38.

The package 10 also includes a die mounting cavity 16 wherein the die 14 is mounted face side down, and a wire bonding cavity 18 wherein wires 22 are located. The die mounting cavity 16 is formed in the first surface 32, and the wire bonding cavity 18 is formed in the second surface 34 of the substrate 12. An elongated interconnect opening 20 in the substrate 12 connects the die mounting cavity 16 to the wire bonding cavity 18, and provides access for bonding the wires 22 to die contacts 24 on the die 14.

In the illustrative embodiment the die 14 includes die contacts 24 located along the center of the die 14. However, the substrate 12 and interconnect opening 20 can be configured for other types of dice such as dice having die contacts formed along an edge or end thereof. U.S. Pat. No. 5,674,785, which is incorporated herein by reference describes various alternate embodiment substrates for electrically connecting to different types of semiconductor dice.

Still referring to FIG. 1, the package 10 also includes a pattern of conductors 26 formed on the second surface 34 of the substrate 12 in electrical communication with the second contacts 38. The conductors 26 include bond pads 28 (FIG. 3) that are bonded to the wires 22, to establish electrical communication between the conductors 26 and the die contacts 24. The wire bonding cavity 16 includes a bonding shelf 30 (FIG. 3) wherein the bond pads 28 (FIG. 3) are located. As will be further explained, the conductors 26 and bond pads 28 can be formed of a highly conductive metal using a metallization process (e.g., CVD, photopatterning, etching).

The package 10 also includes conductive vias 40 (FIG. 1) that electrically connect the first contacts 36 to the second contacts 38. As will be further explained, the conductive vias 40 can be laser machined and etched in the substrate 12, and then filled with a conductive material, such as a metal or conductive polymer.

In addition, an insulating layer 42 is formed on the substrate 12 within the conductive vias 40 and on the first surface 32 and second surface 34 of the substrate 12. The insulating layer 42 electrically insulates the conductive vias 40, the conductors 26, the first contacts 36, and the second contacts 38 from the bulk of the substrate 12. The insulating layer 42 can comprise a grown or deposited insulating material, such as $SiO_2$, $Si_3N_4$, or a deposited polymer, such as polyimide.

The package 10 also includes a die encapsulant 44 (FIG. 1) and a wire encapsulant 46 (FIG. 1). The die encapsulant 44 fills the die mounting cavity 16 and encapsulates the die 14. The wire encapsulant 46 fills the wire bonding cavity 18 and encapsulates the wires 22. Preferably, the die encapsulant 44 and the wire encapsulant 46 comprise a curable polymeric material such as an epoxy, silicone, polyimide, or room temperature vulcanizing material.

Figure 4:
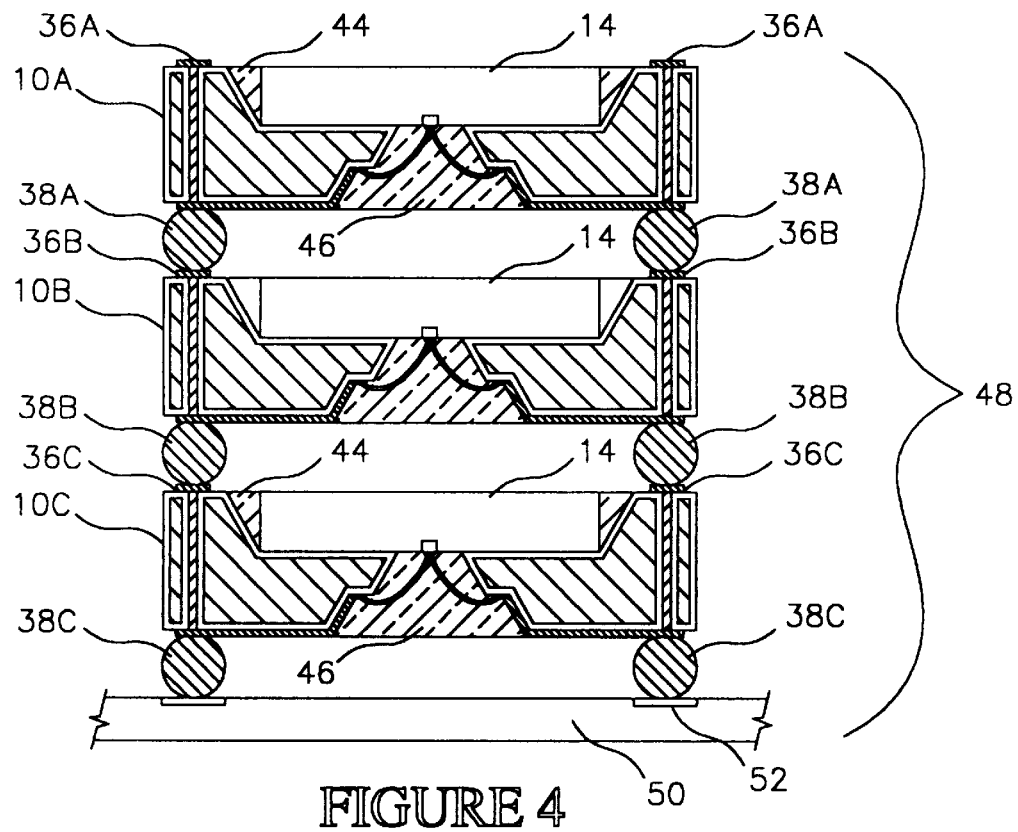
FIG. 4 is schematic cross sectional view of an electronic assembly fabricated using stacked packages.

Referring to FIG. 4, an electronic assembly 48 constructed using three packages 10A, 10B, 10C in a stacked configuration is illustrated. Alternately, rather than three packages, the assembly can include more than three packages but at least two packages. Each chip scale package 10A, 10B, 10C can be substantially identical in construction, and constructed substantially as previously described for package 10.

The assembly 48 includes a supporting substrate 50 such as a printed circuit board (PCB), or ceramic module, having contacts 52. The second contacts 38C on the lowermost package 10C are bonded to the contacts 52 on the supporting substrate 50. In addition, the second contacts 38B on the middle package 10B are bonded to the first contacts 36C on lowermost package 10C. Further, the second contacts 38A on uppermost package 10A are bonded to the first contacts 38B on the middle package 10B.

The bonded connections can be formed using a non-compressive process, such as reflowing second contacts 38A, 38B, 38C formed of solder, onto first contacts 36B, 36C and contacts 52 formed of a solder wettable material. Alternately, a compressive process such as thermocompression bonding, or thermosonic bonding, can be employed. As another alternative, the bonded connections can be formed by fabricating the first contacts 36B, 36C or the second contacts 38A, 38B, 38C of a conductive polymer. The conductive polymer can be deposited in a viscous or semi-cured condition, and then fully cured in physical contact with the mating contacts.

In the assembly 48, the outer package 10A, and the package 10C adjacent to the substrate 50, can include the die encapsulant 44 and the wire encapsulant 46. However, the middle package 10B need not include encapsulants because it is protected on either side by packages 10A and 10C.

Figure 5A:
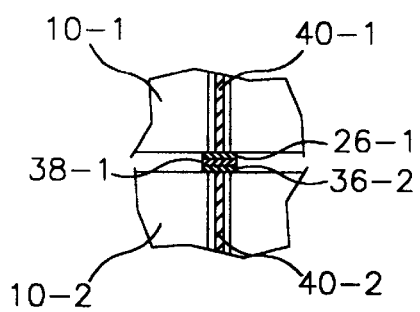
FIGS. 5A–5D are schematic cross sectional views illustrating alternate embodiment mating contacts on adjacent stacked packages.

Referring to FIGS. 5A–5D, alternate bonded connections between adjacent stacked packages are illustrated. In FIG. 5A, a package 10-1 is stacked on a package 10-2. Package 10-1 includes planar second contacts 38-1 in electrical communication with conductors 26-1 and conductive vias 40-1. Package 10-2 includes planar first contact 36-2 in electrical communication with conductive vias 40-2. Bonded connections can be made between the packages 10-1, 10-2 by forming one of the mating contacts 38-1, 36-2 of solder, and the other of a solder wettable metal, and then reflowing one or both of the contacts.

Figure 5B:
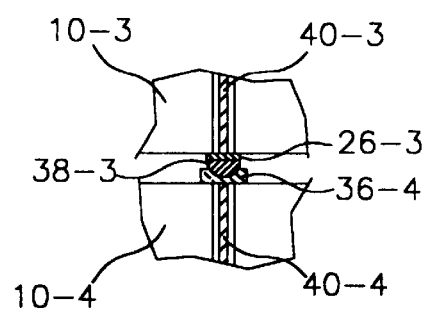

In FIG. 5B, a package 10-3 includes second contacts 38-3 in electrical communication with conductors 26-3 and conductive vias 40-3. An adjacent package 10-4 includes first contacts 36-4 in electrical communication with conductive vias 40-4. In addition, the first contacts 36-4 comprise a conductive polymer material such as an isotropic adhesive (e.g., silver filled silicone) or an anisotropic adhesive (e.g., z-axis epoxy). For forming bonded connections, the conductive polymer first contacts 36-4 can be deposited in a B-stage, or semi-cured condition, and then cured under compression in contact with the second contacts 38-3.

Figure 5C:
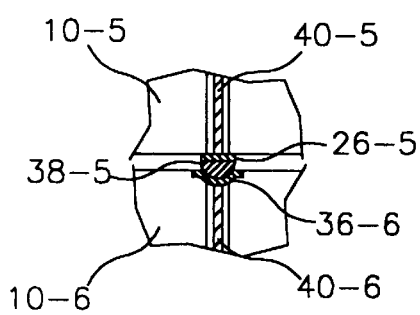

In FIG. 5C, a package 10-5 includes second contacts 38-5 in electrical communication with conductors 26-5 and conductive vias 40-5. An adjacent package 10-6 includes first contacts 36-6 in electrical communication with conductive vias 40-6. The first contacts 36-6 comprise recesses sized and shaped to retain and electrically engage the second contacts 38-5.

Figure 5D:
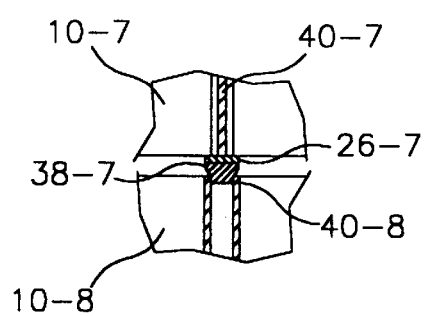

In FIG. 5D, a package 10-7 includes second contacts 38-7 in electrical communication with conductors 26-7. The second contacts 38-7 comprise bumps having cylindrical tip portions. The second contacts 38-7 can be formed using a conventional wire bonding apparatus. An adjacent package 10-8 includes conductive vias 40-8 formed as elongated openings with a conductive layer on the inside diameter (e.g., sidewalls) thereof. The conductive vias 40-8 are configured to receive the cylindrical tip portions of the second contacts 38-7 on package 10-7.

Figure 6A:
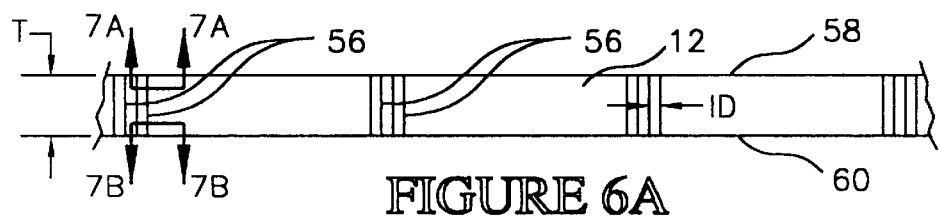
FIGS. 6A–6F are enlarged schematic cross sectional views illustrating steps in a method for fabricating the semiconductor package.

In FIGS. 6A–6F, steps in a method for fabricating the package 10 (FIG. 1) using a wafer level process are illustrated. Referring to FIG. 6A, the substrate 12 can be provided as a wafer 54 (FIG. 9) of monocrystalline silicon. A representative thickness "T" for the substrate 12 can be from 18 mils to 29 mils or greater.

As also shown in FIG. 6A, laser vias 56 can be formed in the substrate 12 using a laser machining apparatus. Forming the laser vias 56 is the first step in the formation of the conductive vias 40 (FIG. 1). A suitable laser machining apparatus is manufactured by General Scanning of Sommerville, Mass. and is designated a model no. 670-W. A representative inside diameter (ID) of the laser vias 56 can be from 10 $\mu$m to 2 mils or greater.

Figure 7A:
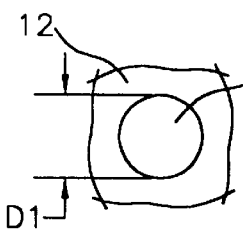
FIG. 7A is an enlarged cross sectional view taken along section line 7A—7A of FIG. 6A illustrating a laser machined via at a laser entry point of a substrate.
Figure 7B:
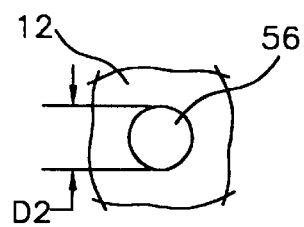
FIG. 7B is an enlarged cross sectional view taken along section line 7B—7B of FIG. 6A illustrating the laser machined via at a laser exit point of the substrate.

As illustrated in FIGS. 7A and 7B, a diameter D1 of the vias 56 at a laser entry point is slightly greater that a diameter D2 of the vias 56 at a laser exit point. The difference between the two diameters will be on the order of a few percentage points or less. The laser vias 56 can be generally perpendicular to a face side 58 (FIG. 6A) and backside 60 (FIG. 6A) of the substrate 12. In addition, the laser vias 56 can be located along a longitudinal axis which will be the center line of the conductive vias 40 (FIG. 1).

A representative laser fluence for forming the laser vias 56 through the substrate 12 with the thickness "T" being about 28 mils, is from about 2 to 10 watts/per via, at a pulse duration of 20–25 ns, and at a repetition rate of up to several thousand per second. The wavelength of the laser beam can be a standard infrared or green wavelength (e.g., 1064 nm–532 nm).

Figure 6B:
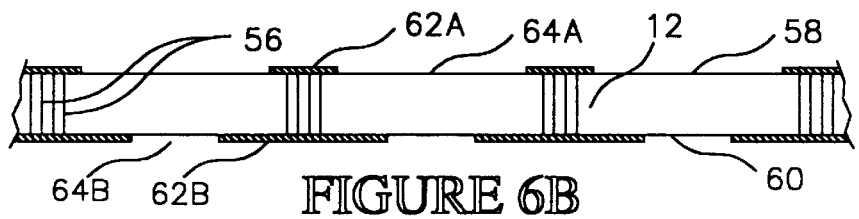

Referring to FIG. 6B, following formation of the laser vias 56, an initial masking step in a two stage etching process for forming the die mounting cavity 16 (FIG. 1), and the wire bonding cavity 18 (FIG. 1) is shown. The two stage etching process will also etch the laser vias 56. Alternately, a one stage etching process can be used to form the die mounting cavity 16 and the wire bonding cavity 18, and to etch the laser vias 56. Prior to the etch step, a cleaning solution such as hydrofluoric acid (HF) can be used to clean the substrate 12 and laser vias 56, and to remove native oxide layers ($SiO_2$) that may be present. In addition, de-ionized water, or solutions containing isopropyl alcohol, can be used to remove the cleaning solution and other contaminants on the substrate 12.

As shown in FIG. 6B, an etch mask 62A can be formed on the face 58 of the substrate, and an etch mask 62B can be formed on the backside 60 of the substrate 12. Preferably, the etch masks 62A, 62B comprise a hard mask material, such as silicon nitride ($Si_3N_4$), deposited to a desired thickness (e.g., 500 Å to 3000 Å) using a suitable deposition process (CVD), and then patterned using a layer of resist (not shown) and a photolithography process. The etch masks 62A, 62B include openings 64A, 64B which expose areas of the substrate 12 for etching.

Figure 6C:
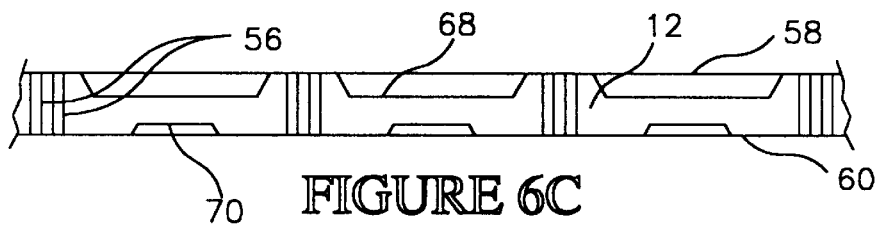

Referring to FIG. 6C, using the etch masks 62A, 62B (FIG. 6B), a wet etchant can be used to anisotropically etch partial cavities 68, 70. Suitable wet etchants include solutions of potassium hydroxide (KOH), and solutions of tetra-methyl ammonium hydroxide (TMAH). During etching of the partial cavities 68, 70 the laser vias 56 can remain covered by the etch masks 62A, 62B. Alternately, the laser vias 56 can be exposed and etched during this etching step.

The anisotropic etch forms the partial cavities 68, 70 with sidewalls that are sloped at an angle of approximately 54° with the horizontal. The slope of the sidewalls is a function of the different etch rates of monocrystalline silicon along the different crystalline orientations. Etching from the face 58 of the substrate 12 produces a slope at first angular orientation, while etching from the backside 60 produces a slope at a second angular orientation. Depending on the dimensional requirements, these etch steps can be performed consecutively or simultaneously.

Following the partial etch step, the etch masks 62A, 62B (FIG. 6B) can be stripped. A wet chemical such as a solution of $H_3PO_4$ can be used to strip the etch masks 62A, 62B (FIG. 6B) selectively with respect to the substrate 12.

Figure 6D:
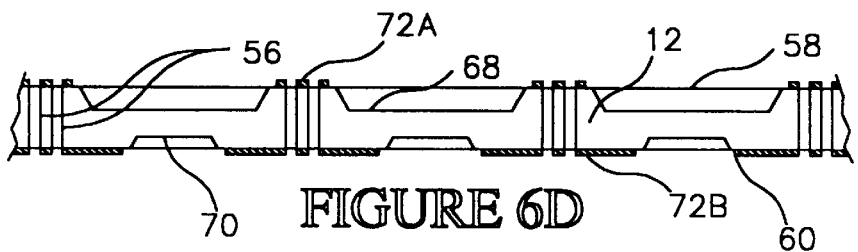

Referring to FIG. 6D, following etching of the partial cavities 68, 70, second etch masks 72A, 72B can be formed on the face 58 and backside 60 of the substrate 12. The second etch masks 72A, 72B expose the partial cavities 68, 70 for final etching. In addition, the second etch masks 72A, 72B expose the laser vias 56 for etching. Preferably, the second etch masks 72A, 72B comprise a hard mask material, such as $Si_3N_4$, as previously described.

Figure 6E:
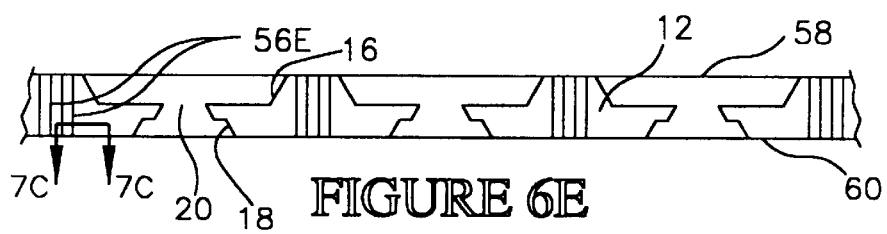

As shown in FIG. 6E, using the etch masks 72A, 72B (FIG. 6D) the die mounting cavity 16, the wire bonding cavity 18, and the interconnect opening 20 can be formed. During this etch step a wet etchant, such as a solution of potassium hydroxide (KOH), or alternately a solution of tetra-methyl ammonium hydroxide (TMAH), can be employed. In addition, etch parameters such as temperature, etch duration, and etchant concentration, can be controlled to achieve desired dimensions and geometries for these features. Following etching of the die mounting cavity 16, and wire bonding cavity 18, the etch masks 72A, 72B can be stripped using a wet etchant such as $H_3PO_4$.

Figure 7C:
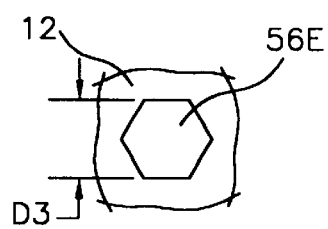
FIG. 7C is an enlarged cross sectional view taken along section line 7C—7C of FIG. 6E illustrating the laser machined via following etching.
Figure 7D:
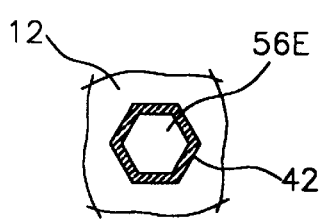
FIG. 7D is an enlarged cross sectional view taken along section line 7D—7D of FIG. 6F illustrating the laser machined via following etching and formation of an insulating layer.

Also during this etch step, the laser vias 56 can be etched to formed etched laser vias 56E. As shown in FIG. 7C, with an anisotropic etch process, the etched laser vias 56E have a smooth-walled, six-sided (hexagonal) cross sectional configuration. A diameter (D3) of the etched laser vias 56E is greater than the initial inside diameter (ID—FIG. 6A) of the laser vias 56. It is theorized that the laser machining process forms an amorphous silicon layer on the sidewalls of the laser vias 56. The subsequent etch process then removes the amorphous silicon layer and enlarges the laser vias 56.

Although in the illustrative process the laser vias 56 are etched at the same time as the substrate 12, a separate etch process can be employed to etch the laser vias 56. Preferably, the substrate 12 has been subjected to an HF dip prior to the etch step to remove native oxide layers ($SiO_2$) present in the laser vias 56. A representative etchant temperature for etching the laser vias 56 can be about 80° C. A representative etch duration for etching the laser vias 56 can be from about 2 minutes to 20 minutes.

Figure 6F:
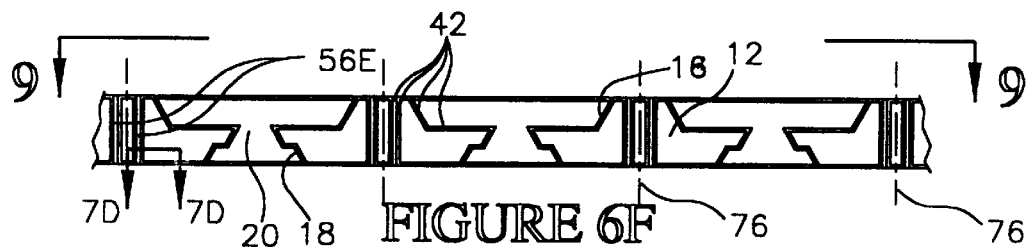

Referring to FIG. 6F, following the etching processes insulating layers 42 can be formed within the etched laser vias 56E and on exposed surfaces of the substrate 12. Insulating layers 42 electrically insulate the conductive vias 40 (FIG. 1) and conductors 26 (FIG. 1) from the bulk of the substrate 12.

The insulating layers 42 can comprise an insulating material, such as $SiO_2$, or $Si_3N_4$, deposited to a desired thickness using CVD, or other deposition process. A $SiO_2$ layer can also be grown on exposed surfaces of the substrate 12 using an oxidizing atmosphere such as steam and $O_2$ at an elevated temperature (e.g., 950° C). The insulating layers 42 can also comprise a polymer, such as polyimide, deposited and planarized using a suitable process (e.g., spin-on-process). Depending on the material, a representative thickness of the insulating layers 42 can be from about a 100 Å to several mils.

Figure 8:
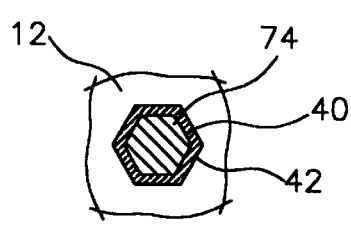
FIG. 8 is an enlarged cross sectional view taken along section line 8—8 of FIG. 1 illustrating a conductive via of the package formed by filling the laser machined and insulated via with a conductive material.
Figure 8A:
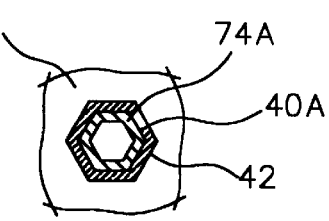
FIG. 8A is an enlarged cross sectional view equivalent to FIG. 8 illustrating an alternate embodiment conductive via having a conductive layer formed on an inside diameter thereof.

Referring to FIG. 8, following formation of the insulating layers 42, the etched laser vias 56E can be filled with a conductive material 74 to complete the conductive vias 40. Alternately, as shown in FIG. 8A, conductive vias 40A can be formed with conductive layers 74A only on the sidewalls of the etched laser vias 56E.

The conductive material 74 (or 74A) can comprise a metal, such as solder, aluminum, titanium, nickel, iridium, copper, gold, tungsten, silver, platinum, palladium, tantalum, molybdenum or alloys of these metals. The metal can be deposited within the etched laser vias 56E using a deposition process, such as CVD, electrolytic deposition or electroless deposition. A solder metal can be screen printed in the etched laser vias 56E, as well as with capillary action, or with a vacuum system using a hot solder wave.

Rather than being a metal, the conductive material 74 (or 74A) can comprise a conductive polymer, such as a metal filled silicone, or an isotropic epoxy. Suitable conductive polymers are sold by A.I. Technology, Trenton, N.J.; Sheldahl, Northfield, Minn.; and 3M, St. Paul, Minn. A conductive polymer can be deposited within the etched laser vias 56E, as a viscous material, and then cured as required. A suitable deposition process, such as screen printing, or stenciling, can be used to deposit the conductive polymer into the etched laser vias 56E.

Figure 2:
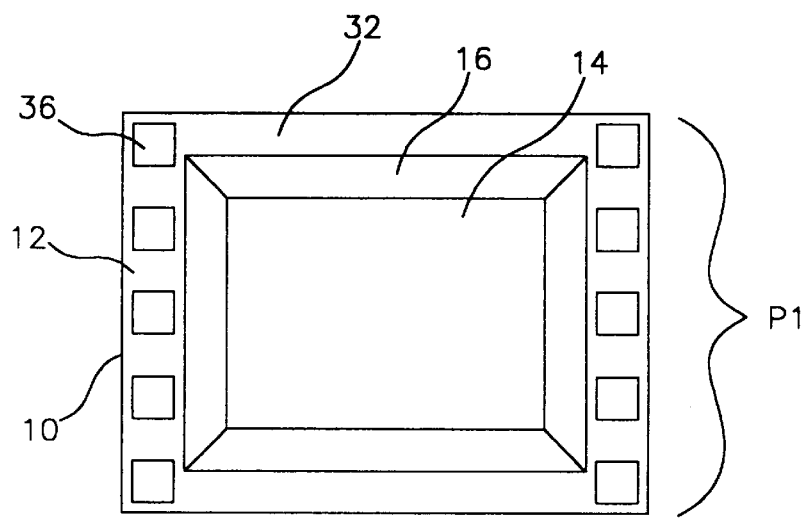
FIG. 2 is an enlarged schematic plan view of the package taken along section line 2—2 of FIG. 1.

Referring again to FIG. 2, following formation of the conductive vias 40 (FIG. 1), the first contacts 36 can be formed in electrical communication with the conductive vias 40. In the embodiment of FIG. 2, the first contacts 36 comprise planar pads. The first contacts 36 can have a circular, square, rectangular or other peripheral configuration.

The first contacts 36 can be formed at the same time and of the same material as the conductive material 74 (FIG. 8) or 74A (FIG. 8A). For example, a metal can be blanket deposited on the first surface 32 of the substrate 12 and into the etched laser openings 56E and then etched to form the first contacts 36. Alternately the first contacts 36 can comprise a different material than the conductive material 74 or 74A, and can be formed using a separate deposition process.

Referring again to FIG. 3, following formation of the conductive vias 40 (FIG. 1), the conductors 26 and bond pads 28 can be fabricated. The conductors 26 can comprise a patterned layer of a highly conductive metal such as aluminum, chromium, titanium, nickel, iridium, copper, gold, tungsten, silver, platinum, palladium, tantalum, molybdenum or alloys of these metals. Rather than being a single layer of metal, the conductors 26 can comprise multi-layered stacks of metals (e.g., bonding layer/barrier layer). The bond pads 28 can be formed using a same process as the conductors 26, or can be formed separately. However, the bond pads 28 must be formed of a wire bondable metal such as aluminum or copper.

By way of example, the conductors 26 and bond pads 28 can be formed using a metallization process (e.g., deposition, photopatterning, etching). The conductors 26 and bond pads 28 can also be formed using a plating process, such as electrolytic deposition, or electroless deposition. A representative thickness of the conductors 26 and bond pads 28 can be from 600 Å to 20000Å.

Figure 3:
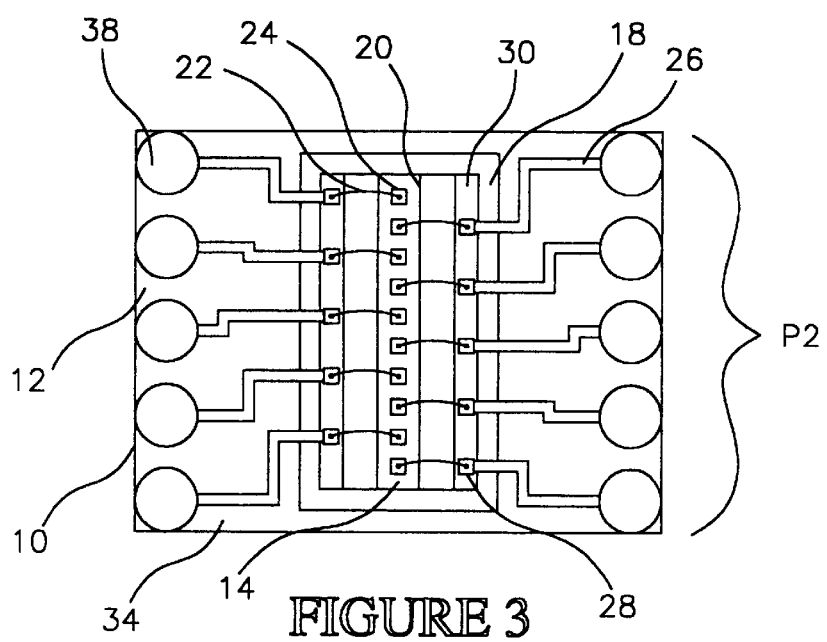
FIG. 3 is an enlarged schematic bottom view of the package taken along section line 3—3 of FIG. 1.

Still referring to FIG. 3, following formation of the conductors 26 and bond pads 28, the second contacts 38 can be fabricated in electrical communication with the conductors 26. The second contacts 38 can comprise a metal or a conductive polymer deposited directly on the conductors 26. For reflow applications, the second contacts 38 can comprise a solder alloy such as 95%Pb/5%Sn, 60%Pb/40%Sn, 63%In/37%Sn, or 62%Pb/36%Sn/2%Ag. The second contacts 38 can also comprise a metal such as nickel, copper, beryllium copper, alloys of nickel, alloys of copper, alloys of beryllium copper, nickel-cobalt-iron alloys and iron-nickel alloys. The second contacts 38 can also comprise a base metal and an outer layer formed of a non-oxidizing metal such as gold, platinum, palladium and iridium. As another alternative, the second contacts 38 can comprise a conductive polymer such as an isotropic or anisotropic adhesive.

Another method for fabricating the second contacts 38 is by bonding pre-fabricated metal balls to the conductors 26. For example, pre-fabricated metal balls are manufactured by Mitsui Comtek Corp. of Saratoga, Calif. under the trademark "SENJU SPARKLE BALLS". The metal balls can be attached to the conductors 26 by soldering, laser reflow, brazing, welding, or applying a conductive adhesive.

A solder ball bumper can also be used to form the second contacts 38 on the conductors 26. A suitable solder ball bumper is manufactured by Pac Tech Packaging Technologies of Falkensee, Germany. The second contacts 38 can also be formed on the conductors 26 using a conventional wire bonder apparatus adapted to form a ball bond, and then to sever the attached wire. The second contacts 38 can also be formed by electrolytic deposition or electroless deposition of a metal to form bumps.

A representative diameter for the second contacts 38 can be from about 4 mils to 50 mils or more. A pitch of the second contacts 38 can be from about 6 mils to 50 mils or more. In addition, the pattern P2 of the second contacts 38 can exactly match the pattern P1 (FIG. 2) of the first contacts 36 (FIG. 2).

Still referring to FIG. 3 following formation of the conductors 26, bond pads 28 and second contacts 38, the die 14 can be placed in the die mounting cavity 16 and wire bonded. If desired, an adhesive layer (not shown), such as a layer of silicone or other die attach adhesive, can be used to attach the face of the die 14 to the die mounting cavity 16.

Figure 9:
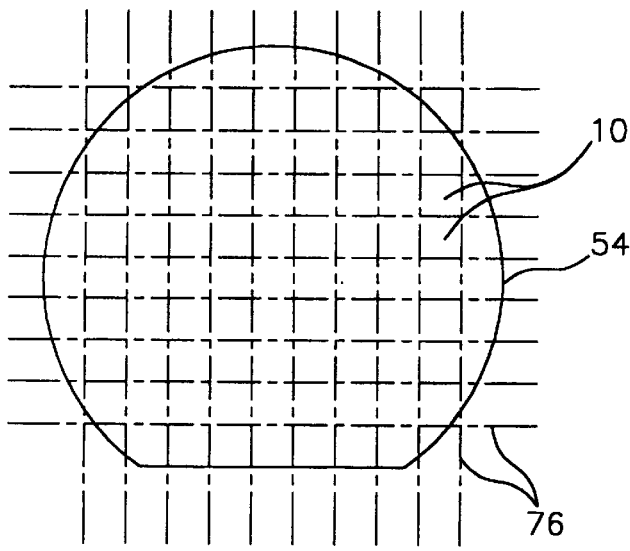
FIG. 9 is a schematic plan view taken along section line 9—9 of FIG. 6F illustrating a wafer containing multiple packages fabricated using the method of the invention.

The wire bonding step can be performed at the wafer level or following singulation of the packages 10 from the wafer 54 (FIG. 9). For example, a conventional wire bonder apparatus can be used to bond wires 22 to the die contacts 24 on the die 14 and to the bond pads 28 on the substrate 12.

Referring again to FIG. 1, following wire bonding, the die encapsulant 44 and the wire encapsulant 46 can be formed. As previously stated the encapsulants 44, 46 can comprise a curable polymeric material such as an epoxy, silicone, polyimide, or room temperature vulcanizing material. These materials can be deposited using a dispensing nozzle or a tool such as a spatula.

Referring to FIG. 9, following encapsulation, the completed packages 10 can be separated from the wafer 54 by sawing or shearing along cut lines 76. For example, a conventional diamond tipped saw can be used to saw the wafer 54 along the cut lines 76.

If the die 14 have been provided as tested known good die (KGD) the packages 10 can be subjected to quick functionality tests, such as continuity of the electrical connections between the die 14 and substrate 12. However, with known good die the packages 10 do not require full functionality and burn-in testing. Alternately, the packages 10 can be tested and burned-in using temporary carriers configured to house the packages 10 for testing. Suitable temporary carriers are disclosed in U.S. Pat. Nos. 5,302,891; 5,408,190; 5,519,332; and 5,541,525 to Wood et al.

Figure 10:
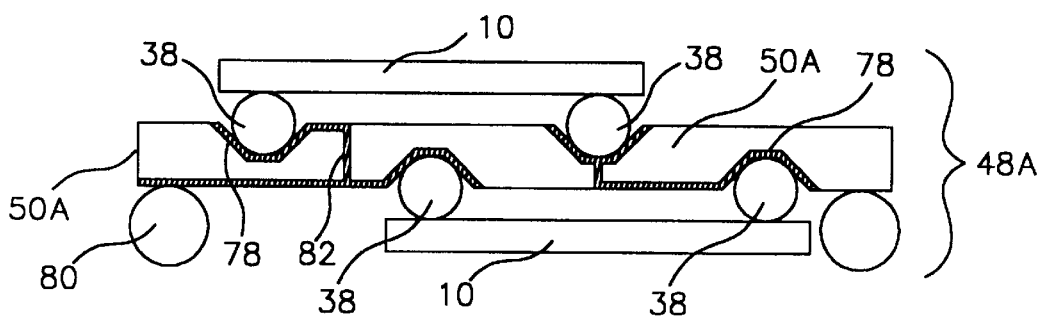
FIG. 10 is an enlarged schematic cross sectional view illustrating an alternate embodiment electronic assembly constructed with the package of the invention.

Referring to FIG. 10, an alternate embodiment electronic assembly 48A constructed with packages 10 is illustrated. In this embodiment a supporting substrate 50A includes recessed contacts 78 configured to retain and electrically engage the second contacts 38 on the packages 10. The supporting substrate 50A and recessed contacts 78 can be fabricated as described in U.S. patent application Ser. No. 08/829,193, entitled "Interconnect Having Recessed Contact Members With Penetrating Blades For Testing Semiconductor Dice And Packages With Contact Bumps".

The recessed contacts 78 are in electrical communication with internal conductors 82 and external contacts 80 on the supporting substrate 50A. Advantageously, the external contacts 80 can have a relatively large diameter (e.g., 30–50 mils) that is greater than the thickness of the packages 10. This permits electrical connections to be made to the external contacts 80 without interference with the packages 10.

Thus the invention provides an improved semiconductor package and method of fabrication. While the invention has been described with reference to certain preferred embodiments, as will be apparent to those skilled in the art, certain changes and modifications can be made without departing from the scope of the invention as defined by the following claims.

What is claimed is:

1. A method for fabricating a semiconductor package comprising:

providing a substrate having a first surface and an opposing second surface;

laser machining a plurality of vias in the substrate from the first surface to the second surface;

at least partially filling the vias with a conductive material to form conductive vias;

forming a plurality of first contacts on the first surface in electrical communication with the conductive vias;

forming a plurality of second contacts on the second surface in electrical communication with the conductive vias; and mounting a die to the substrate in electrical communication with the first contacts or the second contacts.

2. The method of claim 1 wherein the substrate comprises silicon.

3. The method of claim 1 further comprising following laser machining of the vias etching the vias.

4. The method of claim 1 wherein the second contacts are configured to retain and electrically engage third contacts substantially identical to the first contacts.

5. The method of claim 1 further comprising providing a second package having third contacts substantially identical to the first contacts, then stacking the second package on the package with the second contacts retaining and electrically engaging the third contacts.

6. A method for fabricating a semiconductor package comprising:

providing a silicon substrate comprising a first surface and an opposing second surface;

laser machining a via through the substrate from the first surface to the second surface;

etching the via;

forming an insulating layer in the via;

at least partially filling the via with a conductive material to form a conductive via;

forming a first contact on the first surface in electrical communication with the conductive via;

forming a second contact on the second surface in electrical communication with the conductive via, the second contact and the first contact having a mating configuration; and mounting a die to the substrate in electrical communication with the first contact or the second contact.

7. The method of claim 6 wherein the second contacts are configured to retain and electrically engage third contacts substantially similar to the first contacts.

8. The method of claim 6 wherein the first contacts comprise bumps and the second contacts comprise recesses.

9. A method for fabricating a semiconductor package comprising:

providing a substrate having a first surface and an opposing second surface;

forming a conductive via through the substrate from the first surface to the second surface by laser machining a via and at least partially filling the via with a conductive material;

forming a first contact on the first surface in electrical communication with the conductive via;

forming a second contact on the second surface in electrical communication with the conductive via;

mounting a die to the substrate in electrical communication with the first contact or the second contact; and stacking the substrate on a second substrate, the second substrate having a third contact in electrical communication with a second die on the second substrate, the third contact substantially identical to the first contact and bonded to the second contact.

10. The method of claim 9 wherein the substrate comprises silicon and forming the conductive via comprises etching the via following laser machining.

11. The method of claim 9 wherein the substrate comprises silicon and forming the conductive via comprises etching the via, forming an insulating layer on a sidewall of the via, and depositing a conductive layer in the via.

12. A method for fabricating a semiconductor package comprising:

providing a silicon substrate having a first surface and an opposing second surface;

laser machining a plurality of vias in the substrate extending from the first surface to the second surface;

etching the vias;

depositing a conductive material within the vias to form conductive vias;

forming first contacts on the first substrate in electrical communication with the conductive vias;

forming second contacts on the second substrate in electrical communication with the conductive vias, the second contacts configured to retain and electrically engage the first contacts;

mounting a die to the substrate; and forming electrical paths between the die and the first contacts or the second contacts.

13. The method of claim 12 wherein the first contacts comprise bumps and the second contacts comprise recesses.

14. The method of claim 12 wherein the first contacts or the second contacts comprise a conductive polymer.

15. The method of claim 12 wherein the first contacts comprise cylindrical tip portions and the second contacts comprise openings for receiving the tip portions.

16. A method for fabricating a semiconductor package comprising:

providing a first wafer and a second wafer;

forming a plurality of packages on the first wafer and the second wafer, each package including a substrate comprising a portion of the first wafer or the second wafer, and a die in electrical communication with a plurality of first contacts on a first side of the substrate, and with a plurality of second contacts on a second side of the substrate;

stacking the first wafer to the second wafer with selected first contacts on the first wafer in electrical communication with selected second contacts on the second wafer; and cutting the first wafer and the second wafer to form a plurality of stacked packages.

17. The method of claim 16 wherein the first wafer comprises silicon and the second wafer comprises silicon.

18. The method of claim 17 wherein forming the packages comprises laser machining conductive vias on the substrate in electrical communication with the first contacts and the second contacts.

19. The method of claim 18 wherein the selected first contacts are configured to retain and electrically engage the selected second contacts.

20. The method of claim 19 wherein the selected first contacts comprise bumps and the selected second contacts comprise recesses.

21. A method for fabricating a semiconductor package comprising:

providing a first package comprising a first contact on a first surface thereof, and a second contact on a second surface thereof, and a conductive via electrically connecting the first contact to the second contact;

providing a second package substantially identical to the first package and with the second contact on the second package configured to retain and electrically engage the first contact on the first package; and stacking the first package on the second package with the second contact on the second package retaining and electrically engaging the first contact on the first package.

22. The method of claim 21 further comprising forming a conductive polymer layer between the first contact on the first package and the second contact on the second package prior to the stacking step.

23. The method of claim 21 wherein the first contact comprises a bump and the second contact comprises a recess sized to retain the bump.

24. The method of claim 21 wherein the first contact comprises a tip portion and the second contact comprise an opening sized to retain the tip portion.

25. The method of claim 21 wherein the first package is contained on a first wafer and the second package is contained on a second wafer, and further comprising singluating the first package from the first wafer and the second package from the second wafer following the stacking step.

* * * * *